United States Patent [19]
Feldtkeller

[11] Patent Number: 6,049,201
[45] Date of Patent: Apr. 11, 2000

[54] CIRCUIT CONFIGURATION FOR A CHARGE PUMP AND VOLTAGE REGULATOR CIRCUIT HAVING A CIRCUIT CONFIGURATION OF THIS TYPE

[75] Inventor: Martin Feldtkeller, München, Germany

[73] Assignee: Siemens Aktiengesellschaft, Munich, Germany

[21] Appl. No.: 09/299,366

[22] Filed: Apr. 26, 1999

[30] Foreign Application Priority Data

Apr. 24, 1998 [DE] Germany ............... 198 18 465

[51] Int. Cl.[7] .................................................. G05F 1/40
[52] U.S. Cl. ........................ 323/288; 323/284; 363/60
[58] Field of Search ............................ 323/282, 280, 323/288, 289, 284; 363/59, 60

[56] References Cited

U.S. PATENT DOCUMENTS 5,654,628  8/1997  Feldtkeller ..................... 323/282
5,880,579  3/1999  Wei et al. ....................... 323/282

FOREIGN PATENT DOCUMENTS 0 633 662 A1  1/1995  European Pat. Off. .

OTHER PUBLICATIONS

"Efficiency Improvement in Charge Pump Circuits" (Wang et al.), IEEE Journal of Solid State Circuits, vol. 32, No. 6, Jun. 1997, pp. 852–860.

*Primary Examiner*—Shawn Riley
*Attorney, Agent, or Firm*—Herbert L. Lerner; Laurence A. Greenberg; Werner H. Stemer

[57] ABSTRACT

A circuit configuration for a charge pump includes a first series circuit of n integrators and a second series circuit of n further integrators that are connected up to one another via feedback paths. The individual integrators may be configured in the form of controllable integrators which, when used in a voltage regulator circuit, are set depending on the output signal of a regulating amplifier. In particular, the frequency of the charge pump can be adapted in a load-dependent manner with the aid of the controllable integrators.

25 Claims, 7 Drawing Sheets

CIRCUIT CONFIGURATION FOR A CHARGE PUMP AND VOLTAGE REGULATOR CIRCUIT HAVING A CIRCUIT CONFIGURATION OF THIS TYPE

BACKGROUND OF THE INVENTION

Field of the Invention

The present invention relates to a circuit configuration for a charge pump and also to a voltage regulator in which a circuit configuration of this type is used in a charge pump.

The operation of various electronic circuits necessitates the use of voltage regulators that ensure that the operating voltage is as far as possible free from interference and stabilized. Thus, by way of example, electronic units in motor vehicles require voltage regulators which produce an interference-free, stabilized output voltage (of the order of magnitude of approximately 5 V) from the operation voltage (between 12 and 15 V) on which interference is superposed. The voltage regulators used in this field of application must have a very low current consumption (<100 $\mu$A) since the majority of electronic motor vehicle systems remain connected to the on-board electrical system of the motor vehicle even when the motor vehicle is turned off, but the vehicle battery must not be discharged in his case. Furthermore, the voltage regulators used should enable the smallest possible voltage drop between the input and output voltages, in order that an output voltage which is still sufficiently high can be maintained even in the event of dips in the supply voltage or on-board electrical system voltage to 5.5 V, for example.

Charge pumps are frequently used for driving power MOS transistors. To ensure that the charge pump circuit used in this context manages with the smallest possible integrated capacitors, it must, however, be operated at the highest possible frequency, as a result of which, however, the problem of electromagnetic radiation arises. In order to counteract this problem, Published, European Patent Application EP 0 633 662 A1, for example, has proposed a charge pump including a circuit configuration which generates a variety of signals which are nested in one another, in each case two of these signals having flattened edges having precisely complementary profiles with respect to one another, which edges lead to a lower degree of electromagnetic radiation of the charge pump. The circuit configuration described in Published, European Patent Application EP 0 633 662 A1 essentially corresponds to a ring oscillator with two series circuits formed by a plurality of driver stages, the output of the last driver stage of one series circuit being connected to the input of the first driver stage of the other series circuit. The outputs of the driver stages of the individual series circuits are connected to one another via holding stages formed, by way of example, by in each case two inverters connected up oppositely to one another. Inverted output signals can be picked off at the outputs of the individual driver stages. As has already been explained, this circuit configuration can be used to suppress emitted interference, which is of considerable importance in the case of voltage regulators. However, the charge pump described in Published, European Patent Application EP 0 633 662 A1 generates square-wave output signals, as a result of which interference continues to be emitted in principle, albeit in a weakened form.

SUMMARY OF THE INVENTION

It is accordingly an object of the invention to provide a circuit configuration for a charge pump and voltage regulator circuit having a circuit configuration of this type that overcomes the above-mentioned disadvantages of the prior art devices of this general type, in which an improved circuit configuration for the charge pump which, in particular, enables a reduced current consumption and is suitable for use in voltage regulators on smart power ICs in accordance with DMOS technology. Furthermore, the intention is for the circuit configuration to have improved electromagnetic compatibility (EMC). In addition, the present invention is based on the object of providing an improved voltage regulator that has a reduced current consumption for a predetermined maximum output voltage.

With the foregoing and other objects in view there is provided, in accordance with the invention, a circuit configuration for a charge pump, including:

a first series circuit of n integrators having a first integrator and a last integrator generating an output signal;

a first feedback path and a second feedback path;

one of the integrators of the first series circuit generating an output signal and receiving, as an input signal, a summation signal formed from the output signal of the one of the integrators of the first series circuit fed back via the first feedback path, a second input signal and a third input signal;

a second series circuit of n further integrators having a first integrator and a last integrator generating an output signal;

a further first feedback path and a further second feedback path;

one of the integrators of the second series circuit generating an output signal and receiving, as an input signal, a summation signal formed from the output signal of the one of the integrators of the second series circuit fed back via the further first feedback path, a second input signal and a third input signal;

the output signal of the one of the integrators of the second series circuit fed back via the second feedback path forming the second input signal of the one of the integrators of the first series circuit;

the output signal of the one of the integrators of the first series circuit fed back via the further second feedback path forming the second input signal of the one of the integrators of the second series circuit;

the output signal of the last integrator of the second series circuit forming the third input signal of the one of the integrators corresponding to the first integrator of the first series circuit;

the output signal of the last integrator of the first series circuit supplying the third input signal of the one of the integrators corresponding to the first integrator of the second series circuit;

the third input signal for remaining integrators of the first series circuit supplied by an output signal of a preceding integrator of the integrators of the first series circuit;

the third input signal for remaining integrators of the second series circuit supplied by an output signal of a preceding integrator Df the integrators of the second series circuit; and the integrators of the first series circuit and the second series circuit having outputs that can be picked off outputting output signals phase-shifted with respect to one another.

According to the present invention, the circuit configuration has two series circuits formed by a plurality of integrators which are each coupled to one another via corresponding feedback paths, with the result that corresponding sinusoidal output signals which are offset in phase with respect to one another can be generated at the outputs of the individual integrators. This being advantageous with regard to the electromagnetic compatibility (EMC), in contrast to the phase-shifted square-wave pulses known from Published, European Patent Application EP 0 633 662 A1. The circuit configuration advantageously contains four integrators that, consequently, generate four approximately sinusoidal output signals which are offset in phase in each case by 90° relative to one another.

The integrators are advantageously realized in the form of controlled inverters with a plurality of inputs, with the result that specific properties of the integrators can be altered by the application of corresponding control signals. In this case, this aspect of the invention is based, in particular, on the insight that the current consumption of the circuit configuration or of the entire voltage regulator can be distinctly reduced if the (circuit) frequency of the charge pump is reduced to an extent such that the current output of the charge pump decreases to a required value. Consequently, by driving the controllable integrators of the circuit configuration, it is possible to generate for example four approximately sinusoidal output signals which are offset in phase in each case by 90° relative to one another and whose frequency can be altered with the aid of external control signals.

The use of the circuit configuration according to the invention in a voltage regulator of the type described in the introduction is particularly advantageous if the regulating amplifier used in the process is configured as a so-called Class B amplifier with a low quiescent current and, given a sufficiently high input voltage, generates a control signal for the charge pump of the voltage regulator which corresponds to the output frequency zero. In this context, use is made of an additional current source that maintains the gate charge necessary for the DMOS actuating transistor in this case.

The variable-frequency charge pump proposed in connection with the voltage regulator according to the invention can be used, in particular, for so-called high side switches, in which rapid switching on and, once the switch has been switched on, a low degree of interference emission together with a low current consumption are required.

Other features which are considered as characteristic for the invention are set forth in the appended claims.

Although the invention is illustrated and described herein as embodied in a circuit configuration for a charge pump and voltage regulator circuit having a circuit configuration of this type, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 8 thereof, there is shown a simplified block diagram of a known voltage regulator circuit with a pnp actuating transistor T being used as the actuator. With the aid of the actuating transistor T, an input voltage $U_e$ is converted into an output voltage $U_a$ which is as far as possible free from interference and stabilized. One input terminal of a regulating amplifier RV monitors the output voltage $U_a$ and generates an actuating signal for a controllable current source I on the basis of a comparison with a reference voltage $U_{ref}$ applied to the other input terminal, which controllable current source generates a control current for the actuating transistor T. As a result of the interaction of the actuating transistor T with the regulating amplifier RV and the controllable current source I, the desired stabilized output voltage $U_a$ can be produced. The use of the pnp actuating transistor T shown in FIG. 8 is advantageous on account of the cost-effective bipolar technology used in this context, which enables powerful pnp transistors.

However, the trend in future electronic units is toward "Systems on Silicon", that is to say the intention is for a chip to be able to include as many different functions as possible in order that a unit can be constructed from as few chips as possible. Endeavors are being made, therefore, to integrate voltage regulators on so-called "Smart Power Chips" which are fabricated in accordance with a hybrid technology, which are optimized, on the one hand, for DMOS power transistors and CMOS logic, and, in addition, have bipolar components. A further aim is to keep the external circuitry of the voltage regulators as small as possible.

Figure 8:
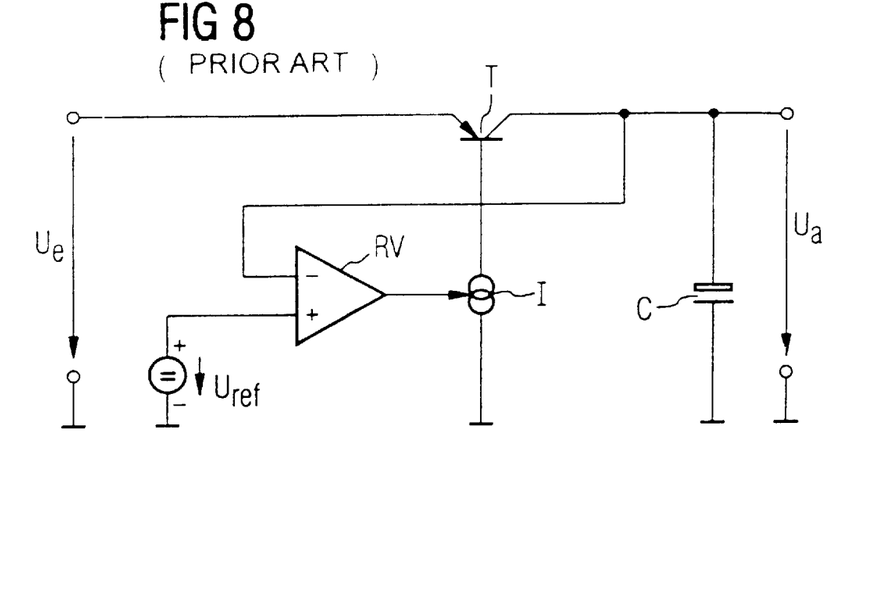
FIGS. 8–10 are circuit diagrams of prior art voltage regulators.

The voltage regulator shown in FIG. 8 and containing the pnp bipolar transistor T always requires a dedicated chip, however. In addition, the low transition frequency of integrated lateral pnp transistors means that the relatively large output capacitor C, Likewise shown in FIG. 8, is necessary, which output capacitor has a low series resistance over the widest possible temperature range. By way of example, the capacitor C may be formed by a tantalum electrolytic capacitor having a capacitance of between 10 and 22 $\mu$F.

Figure 9:
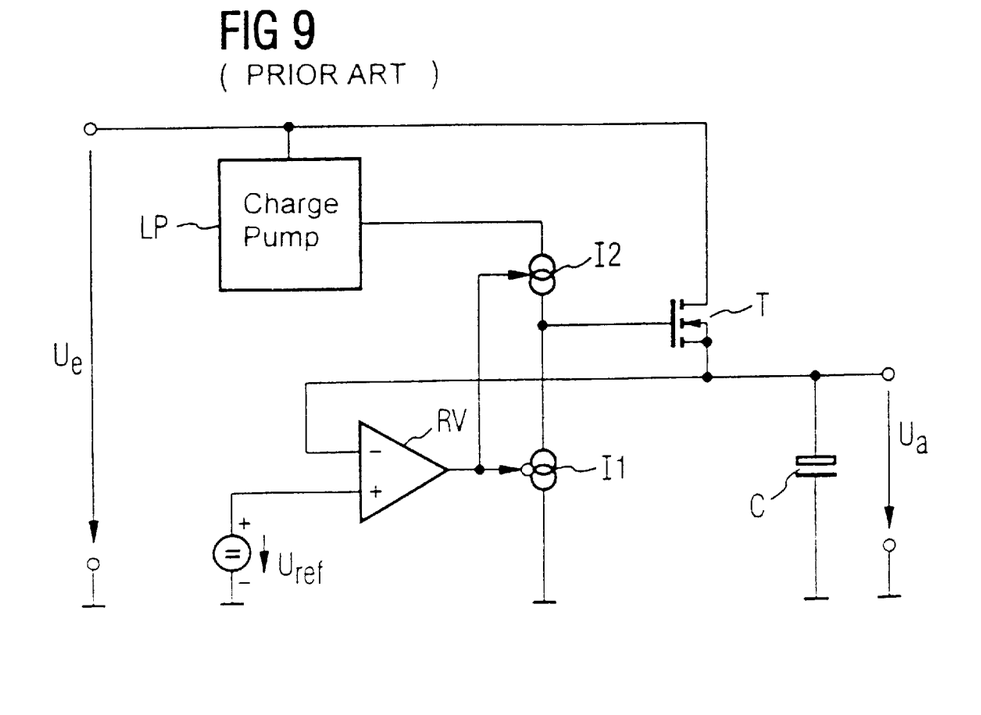

For smart power technologies, therefore, use has been made heretofore of voltage regulators having a DMOS actuating transistor with an associated charge pump for producing the requisite high gate voltage. FIG. 9 shows a block diagram of a known DMOS voltage regulator circuit. It is evident from FIG. 9 that an n-channel DMOS field-effect transistor is used as the actuating transistor T, the gate terminal of which field-effect transistor is driven by controllable current sources I1 and I2. The two current sources I1 and I2 are driven, for their part, by the output signal of the regulating amplifier RV, the current source I1 being set by the output signal of the regulating amplifier RV in an inverted manner with respect to the current source I2. Furthermore, FIG. 9 illustrates a charge pump LP, which ensures that an increased gate voltage is applied to the gate terminal of the actuating transistor T.

The voltage regulator shown in FIG. 9 has the disadvantage, however, in that it has a very high current consumption (for example a few mA) on account of the quiescent current consumption of the charge pump LP, with the result that in motor vehicle applications, for example, the voltage regulator must also be switched off when the vehicle is turned off. However, the use of n-channel DMOS transistors is advantageous in voltage regulators because, in general, pnp or p-channel MOS transistors are not suitable for smart power chips since they can only be operated with low current densities given application of the smart power technology.

Figure 10:
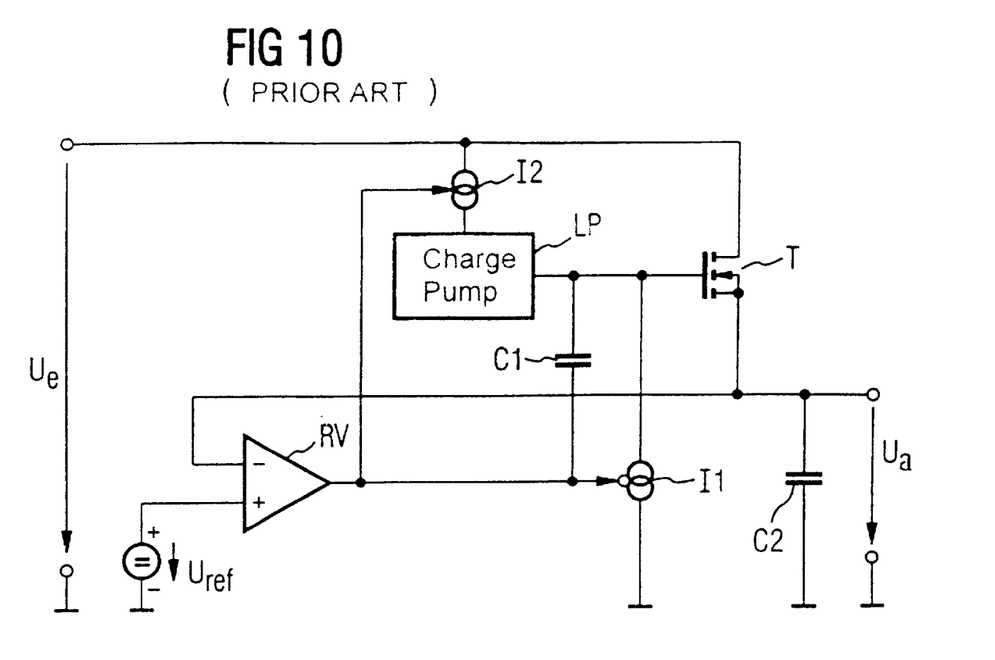

FIG. 10 shows a block diagram of a further known voltage regulator circuit, as is disclosed in U.S. Pat. No. 5,654,628, for example. This voltage regulator includes an input terminal for receiving an (unregulated) input voltage $U_e$ and an output terminal for providing a (regulated) output voltage $U_a$, an n-channel DIOS field-effect transistor T being connected as the actuator between the input and output terminals. Furthermore, use is again made of the regulating amplifier RV, which receives the regulated output voltage $U_a$ at one of its inputs and generates a corresponding output signal for the controllable current sources I1 and I2. A capacitor C1 is connected between the output terminal of the regulating amplifier RV and the control terminal of the transistor T. The current source I2 corresponds to the internal current source of the charge pump LP, which, owing to corresponding driving by the regulating amplifier RV, generates an increased output voltage for the transistor T, in order to boost the gate voltage of the transistor T. The current source I1 serves for discharging the capacitor C1, in which case, in the event of a drop in the output voltage $U_a$, an increased output signal of the regulating amplifier RV ensures that the current of the current source I1 is reduced owing to the inverted driving by the regulating amplifier RV. Furthermore, the output signal of the regulating amplifier RV is fed to the transistor T via the capacitor C1, with the result that the signal $U_a$ at the output terminal is increased owing to the relatively constant voltage drop along the gate-source path of the transistor T. With the aid of the capacitor C1, rapid output-side load changes of the voltage regulator can be compensated for, and the voltage regulator can also operate stably with a small output capacitance C2 (for example with a 100 µF ceramic capacitor).

Figure 1:
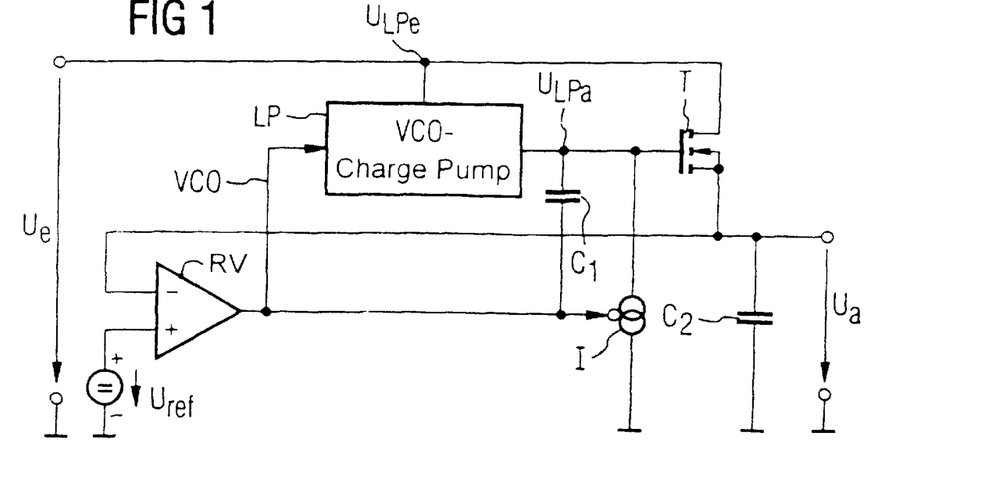
FIG. 1 is a diagrammatic, block diagram of a preferred exemplary embodiment of a voltage regulator according to the invention.

A voltage regulator according to the invention that essentially corresponds to the voltage regulator shown in FIG. 10 is shown in FIG. 1. The voltage regulator shown in FIG. 1 includes the input terminal for receiving the unregulated input voltage $U_e$ and also the output terminal for providing the (regulated) output voltage $U_a$. The actuating transistor T is connected by its main current path or its load path between the input and output terminals. In accordance with FIG. 1, the transistor T is configured, in particular, in the form of an N-channel DMOS field-effect transistor. At its inverted input, the regulating amplifier RV monitors the output voltage $U_a$ provided at the output terminal and compares the output voltage with the reference voltage $U_{ref}$ applied to its further input. The capacitor C1 is connected between the output of the regulating amplifier RV and the control or gate terminal of the actuating transistor T. The current source I serves for discharging the capacitor C1 and is controlled in an inverted manner by the output signal of the regulating amplifier RV. Furthermore, provision is made of the charge pump LP that generates an increased voltage for the control terminal of the actuating transistor T. An output capacitor C2 is provided at the output of the voltage regulator, and the output voltage $U_a$ is output via the capacitor C2.

In contrast to the voltage regulator shown in FIG. 10, however, in accordance with the exemplary embodiment shown in FIG. 1, the frequency of the charge pump LP is set by the output signal of the regulating amplifier RV. That is to say the charge pump LP is a voltage-controlled, variable-frequency charge pump (VCO charge pump), the frequency of the charge pump LP being adapted to the respective requirements for the purpose of reducing the current consumption.

This will be explained in more detail below with reference to the diagrams illustrated in FIGS. 2a–2c.

Figure 2A:
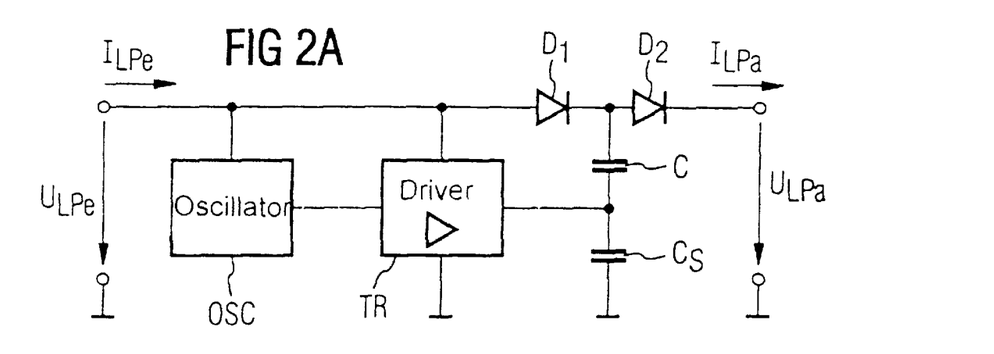
FIG. 2a is a block diagram of a doubling charge pump.

FIG. 2a shows a greatly simplified block diagram of a doubling charge pump which, in accordance with FIG. 1 receives a voltage $U_{LPe}$ as an input voltage and outputs an output voltage $U_{LPa}$. In accordance with FIG. 2a the charge pump can be represented as a combination of a ring oscillator OSC with a downstream driver TR. The output signals of the driver TR being output via a diode-capacitor network having diodes D1 and D2 as well as a pump capacitor C. Furthermore, FIG. 2a illustrates a capacitor Cs, which corresponds to the unavoidable parasitic substrate capacitance of the pump capacitors used in the charge pump. The parasitic substrate capacitance being governed by the monolithic integration. The following relationships exist between the current $I_{LPe}$ taken up by the doubling charge pump and the current $I_{LPa}$ that is output:

$$I_{LPe} = C_s \cdot f \cdot U_{LPe} + 2 \cdot C \cdot f \cdot (2 \cdot U_{LPe} - U_{LPa} - 2 \cdot U_D)$$

$$I_{LPa} = C \cdot f \cdot (2 \cdot U_{LPe} - U_{LPa} - 2 \cdot U_D)$$

Figure 2B:
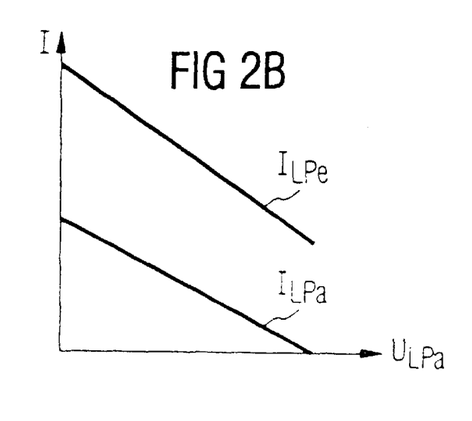
FIGS. 2b–2c are graphs elucidating why a current consumption can be reduced by reducing a frequency of the charge pump.

FIG. 2b illustrates the profile of the current $I_{LPe}$ that is taken up and the current $I_{LPa}$ that is output, as a function of the output voltage $U_{LPa}$ of the doubling charge pump. It is evident from the above formulas that the charging current necessary for periodic charging and discharging of the parasitic capacitances constitutes a main proportion of the no-load current consumption of a charge pump. Further proportions of the quiescent current consumption of the charge pump are produced, moreover, by shunt currents of the driver stages TR and by the current consumption of the oscillator OSC.

Figure 2C:
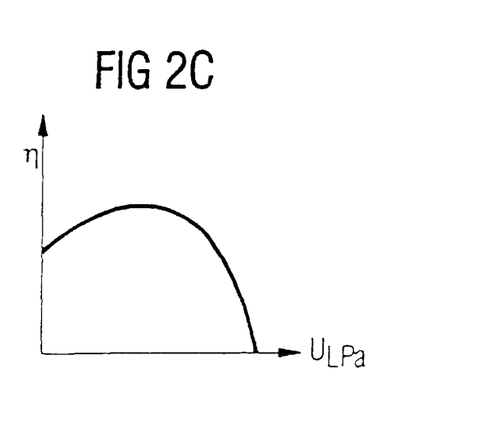

In a supplementary manner, FIG. 2c illustrates the efficiency as a function of the output voltage $U_{LPa}$. In this case, it is evident from FIG. 2c that, in the event of no-load operation of the charge pump, the efficiency n is equal to zero and has a maximum at an output voltage ULPa=7 V given an input voltage ULPe=5 V, a useful. capacitance C=5 pF and a substrate capacitance Cs=1.2 pF. If only a low power output is required from the charge pump, this being the case for example with a settled regulating circuit and with low loading on the voltage regulator, the charge pump should not operate under no load for this reason, which would initially be obvious, or the input voltage $U_{LPe}$ of the charge pump should be reduced, which is proposed in accordance with U.S. Pat. No. 5,654,628 (see FIG. 10).

Rather, it is advantageous to reduce, instead, the frequency of the charge pump to an extent such that the current output of the charge pump decreases to the desired or required value, in order to obtain a very low current consumption. Therefore, according to FIG. 1, the charge pump LP is configured in such a way that its frequency is variable depending on the output signal of the regulating amplifier RV. In this case, the charge pump LP may be configured as a multiphase charge pump which generates a plurality of sinusoidal output signals which are offset in phase relative to one another. It being possible to alter the frequency of these output signals with the aid of the control signal VCO of the regulating amplifier RV. The highest frequency that can be generated by the charge pump LP should advantageously be just as high as the frequency that can be generated with the aid of an oscillator based on inverter transit times (see Published European Patent Application EP 0 633 662 A1) described in the introduction.

The use of variable-frequency charge pumps has already been disclosed, in principle, in IEEE Journal of Solid State Circuits, Vol. 32, No. 6, June 1997, "Efficiency Improvement in Charge Pump Circuits". In particular, the document describes the problem whereby charge pumps use transistor circuits which are operated at a specific switching frequency. The switching frequency being defined, according to the known prior art, in such a way that a sufficiently high output signal level can be obtained even with a maximum output load of the charge pump. The consequence of this being, however, that in the event of low loading on the charge pump, a considerable supply current is unnecessarily required, the consequence being a considerable energy consumption particularly in the case of systems which, for the most part, are operated without a load. Accordingly, this document proposed varying the switching frequency of the charge pump depending on the load, with the result that switching frequency of the charge pump is reduced in the event of a smaller load. This results in an improved performance, a lower current consumption and less stringent breakdown voltage requirements for the charge pump. This document does not, however, describe the use of the charge pump in voltage regulator circuits, with the result that this document also does not make any proposal as to how the driving of the charge pump could be effected in a voltage regulator circuit, in order to vary the frequency of the charge pump.

Figure 3:
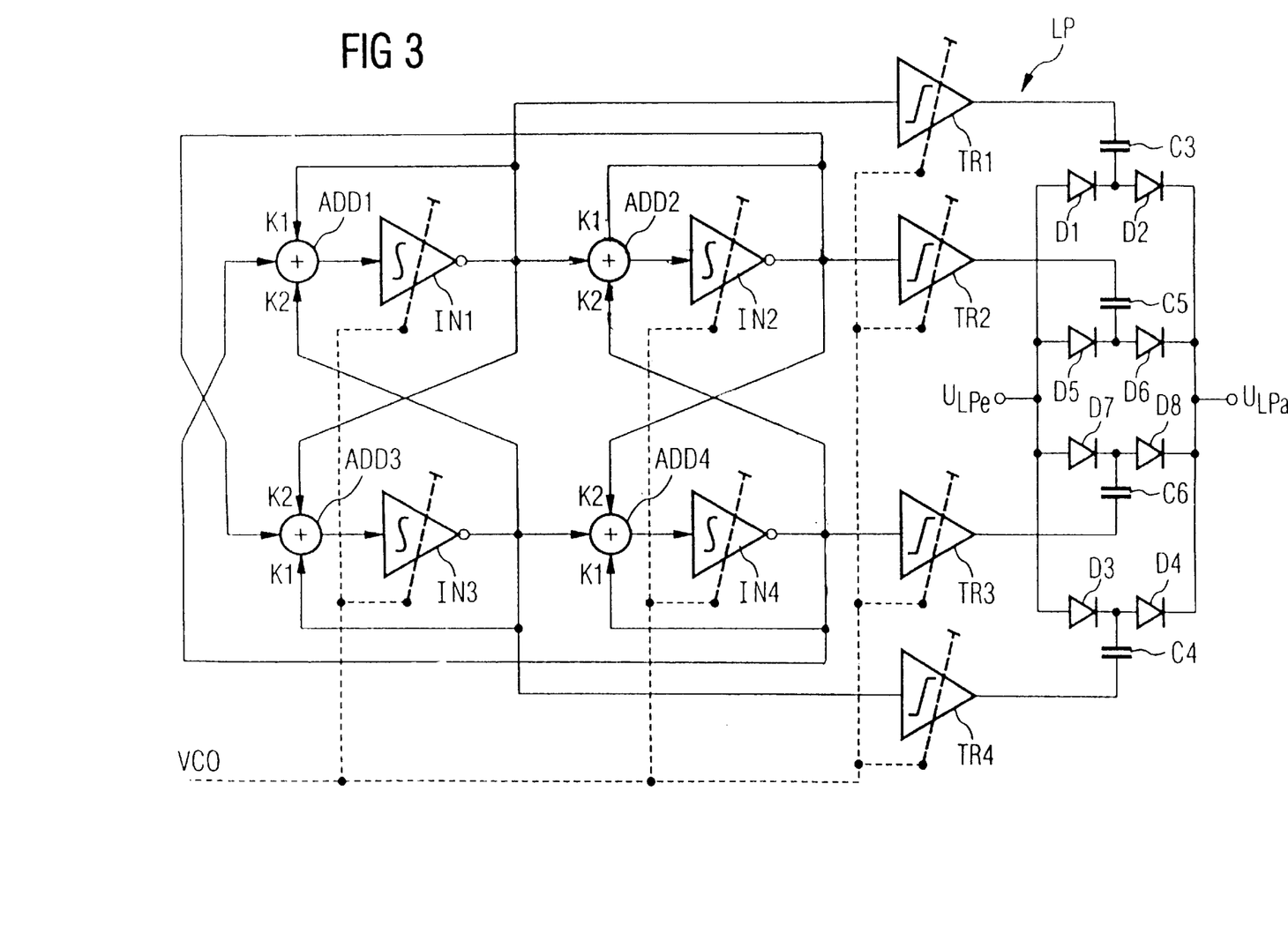
FIG. 3 is a circuit diagram of a preferred exemplary embodiment of a circuit configuration for the charge pump.

By contrast, FIG. 3 shows a circuit diagram of a preferred exemplary embodiment of the variable-frequency charge pump LP which is illustrated in FIG. 1 and which additionally fulfills the previously known preconditions. The circuit shown in FIG. 3 includes two series circuits having a plurality of jointly driven integrators IN1–IN4, the individual integrators IN1–IN4 being connected up to one another via feedback paths. In particular, FIG. 3 illustrates an example of a doubling multiphase charge pump, each series circuit having two controlled integrators IN1, IN2 and IN3, IN4, respectively. The output of the last integrator of each series circuit is passed to the input of the first integrator of the other series circuit. Furthermore, the output of each integrator is passed to its input via a first feedback path having the gain factor K1 and to the input of the corresponding integrator of the other series circuit via a second feedback path having the gain factor K2. The input signal of each integrator IN1–IN4 corresponds to the output signal of an adder ADD1–ADD4. Consequently, the input signal of the integrators IN1 and IN3 corresponds to the summation signal including the output signal of the integrator IN4 and of the integrator IN2, respectively, the output signal of the integrator IN1 and IN3, respectively, multiplied by the gain factor K1 and the output signal of the integrator IN3 and IN1, respectively, multiplied by the gain factor K2. On the other hand, the input signal of the integrators IN2 and IN4 corresponds to the summation signal including the output signal of the integrator IN1 and IN3, respectively, the output signal of the integrator IN2 and IN4, respectively, multiplied by the gain factor K1 and the output signal of the integrator IN4 and IN2, respectively, multiplied by the gain factor K2.

The gain factors of the feedback paths are set in such a way that the following holds true: K2>K1, K2−K1<1 (oscillation condition) and K1+K2>1 (stability condition).

According to FIG. 3, the individual integrators IN1–IN4 are driven depending on the control signal VCO of the regulating amplifier RV shown in FIG. 1. Approximately sinusoidal output signals which are offset in phase in each case by 90° with respect to one another are picked off at the outputs of the individual integrators INI–IN4 and are passed via driver stages TR1–TR4. It being the case that these driver stages TR1–TR4 are also preferably set depending on the control signal VCO, in order, for example, to alter the edge steepness of the drivers TR1–TR4. The output signals are combined, by a diode-capacitor network having capacitors C3–C6 and diodes D1–D8, with the input voltage $U_{Lpe}$ applied to the charge pump, in order finally to obtain the increased output voltage $U_{LPa}$.

Although the circuit configuration is configured, according to FIG. 3, with controllable Lntegrators IN1–IN4 and controllable drivers TR1–TR4, the circuit configuration shown in FIG. 3 can, of course, also be configured without a control capability for the integrators and/or drivers, since in this case too, sinusoidal signals which are offset in phase with respect to one another can be picked off at the outputs of the integrators, this being distinctly advantageous, with regard to the electromagnetic compatibility (EMC) in comparison with the phase-shifted square-wave pulses disclosed in Published, European Patent Application EP 0 633 662 A1.

Figure 4:
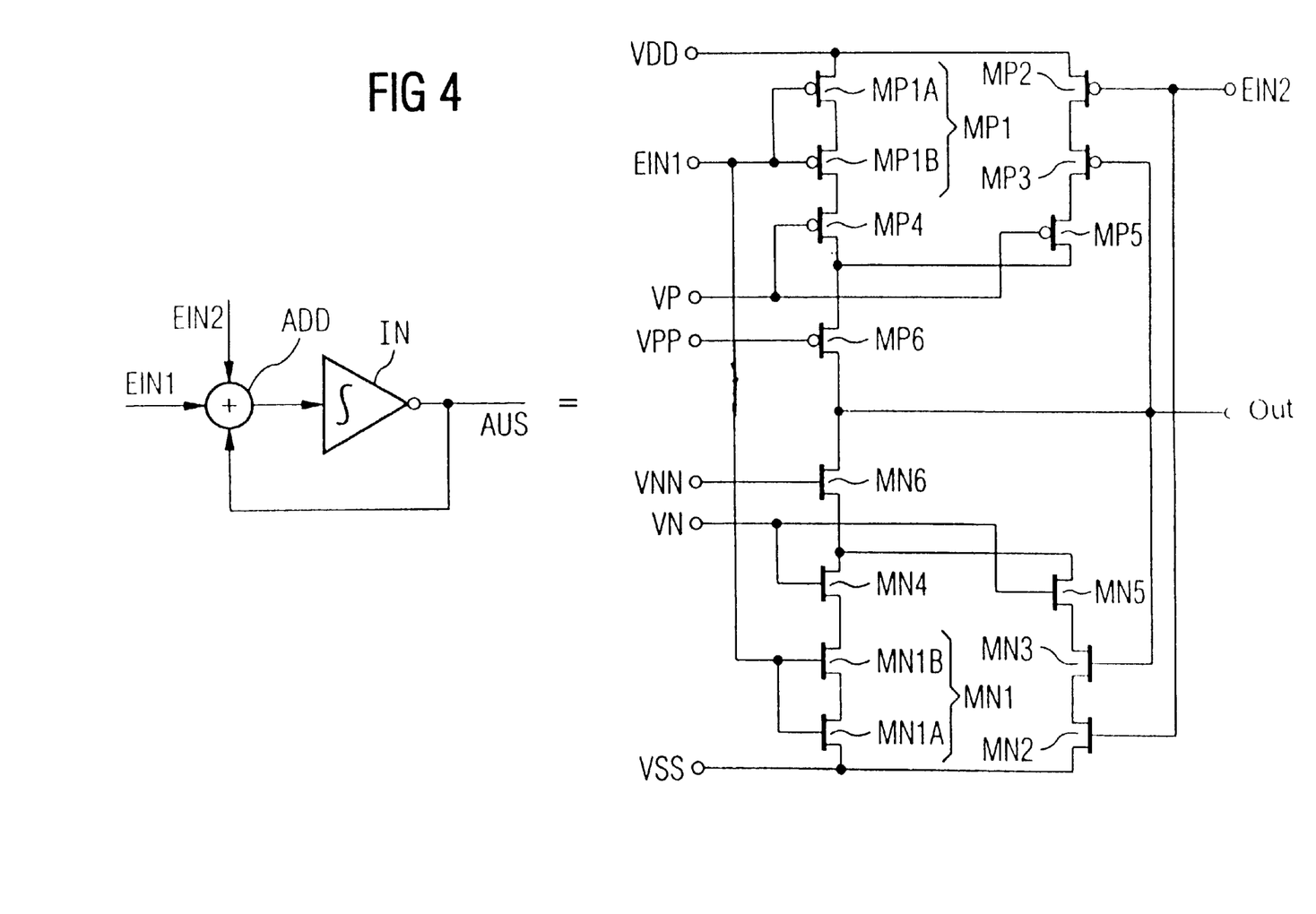
FIG. 4 is a circuit diagram of an integrator illustrated in FIG. 3.

The controlled integrators IN1–IN4 shown in FIG. 3 can be realized as controlled inverters with a plurality of inputs, in particular a plurality of control inputs. In this case, the controllable transfer characteristic of the inverter forms, together with the wiring capacitance, in each case a controllable integrator. FIG. 4 shows a possible circuit for a controllable integrator.

According to FIG. 4, the circuit contains a positive supply voltage terminal VDD, a negative supply voltage terminal VSS, a first input terminal IN1 for the first input signal of the corresponding adder, a second input terminal IN2 for the second input signal of the corresponding adder and also four control terminals VP, VPP, VNN and VN, to which corresponding control signals are to be applied. The integrator or inverter shown in FIG. 4 is constructed using a combination circuit of p-channel and n-channel junction field-effect transistors. In this case, the transistors MN1–MN3 and MP1–MP3 form controlled resistors which are dependent on the input signals. The resistors can optionally be connected in parallel or in series, connection in parallel enabling the maximum possible frequency of the oscillator of the charge pump to be increased and connection in series enabling the current consumption of the oscillator to be reduced. In accordance with the exemplary embodiment shown in FIG. 4, a combination of connection in parallel and connection in series was chosen, which turned out to be a favorable compromise, in each case two transistors MN2, MN3 and MP2, MP3, respectively, being connected in series, while a further transistor MN1 and MP1, respectively, is disposed in parallel therewith. For reasons of manufacturability, however, according to FIG. 4 the transistors MN1 and MP1 which are not connected in series are also likewise configured in the form of a series circuit respectively including two transistors MN1A and MN1B, and MP1A and MP1B. The requisite gain factors of the individual inputs can be set by different channel lengths and channel widths of the transistors. Furthermore, the circuit shown in FIG. 4 includes transistors MN4, MN5 and MN5, MP5, which serve as current source transistors and, depending on the control signals VP and VN, control the total current flow via the inverter and hence the transfer characteristic of the inverter. In addition, it is optionally possible to insert cascade transistors MP6 and MN6, which are controlled by the control signals VPP and VNN, respectively, and serve to extend the frequency range. What is evident overall from FIG. 4 is that the inverter circuit consists of essentially mirror-symmetrical p-channel and n-channel MOS transistor regions.

Figure 5:
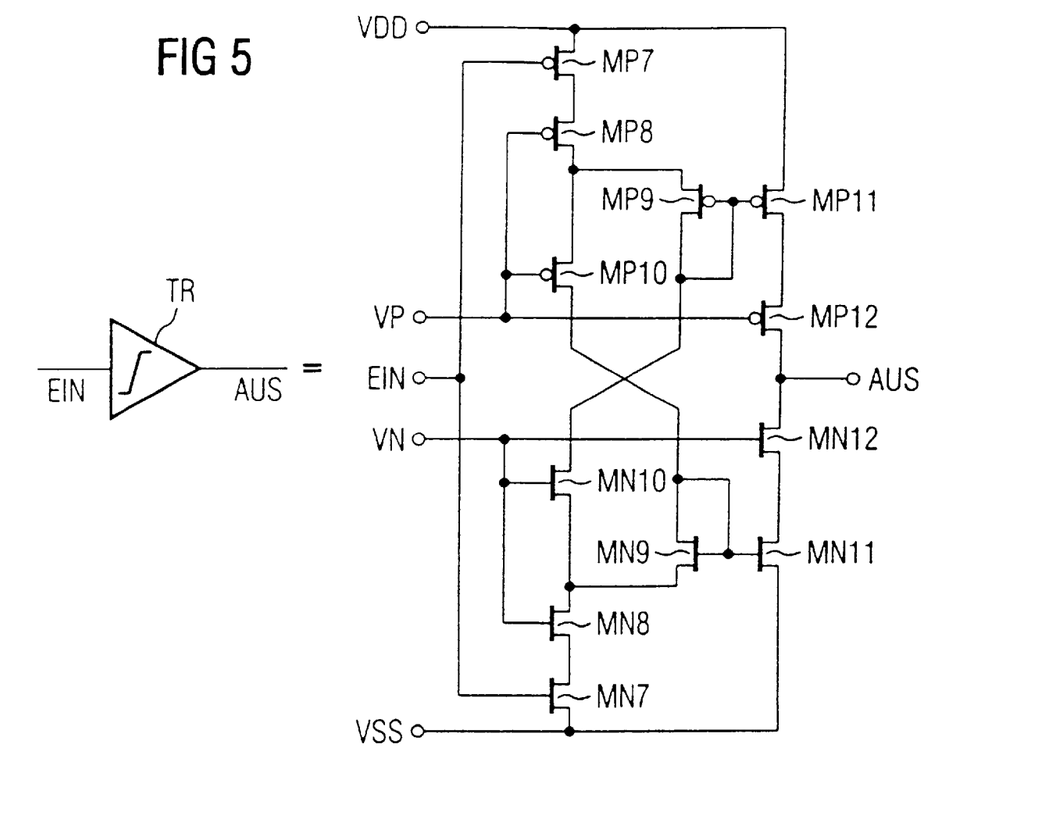
FIG. 5 is a circuit diagram of a driver shown in FIG. 3.

As has already been explained with reference to FIG. 3, the individual drivers TR1–TR4 can also be set depending on the output signal of the regulating amplifier RV, it being particularly expedient, for minimum interference radiation, to set the edge steepnesses of these output drivers proportionally to the oscillator frequency of the charge pump. FIG. 5 shows an example of a shunt current-free driver circuit having the features mentioned, it being possible for the edge steepness to be set, in particular, depending on the control signals VN, VP (cf. FIG. 4). The driver circuit shown in FIG. 5 also once again includes the combination of p-channel and n-channel MOS junction transistors MP7–MP12 and MN7–MN12, respectively, the region having the p-channel transistors being constructed essentially mirror-symmetrically with respect to the region having the n-channel transistors.

Figure 6:
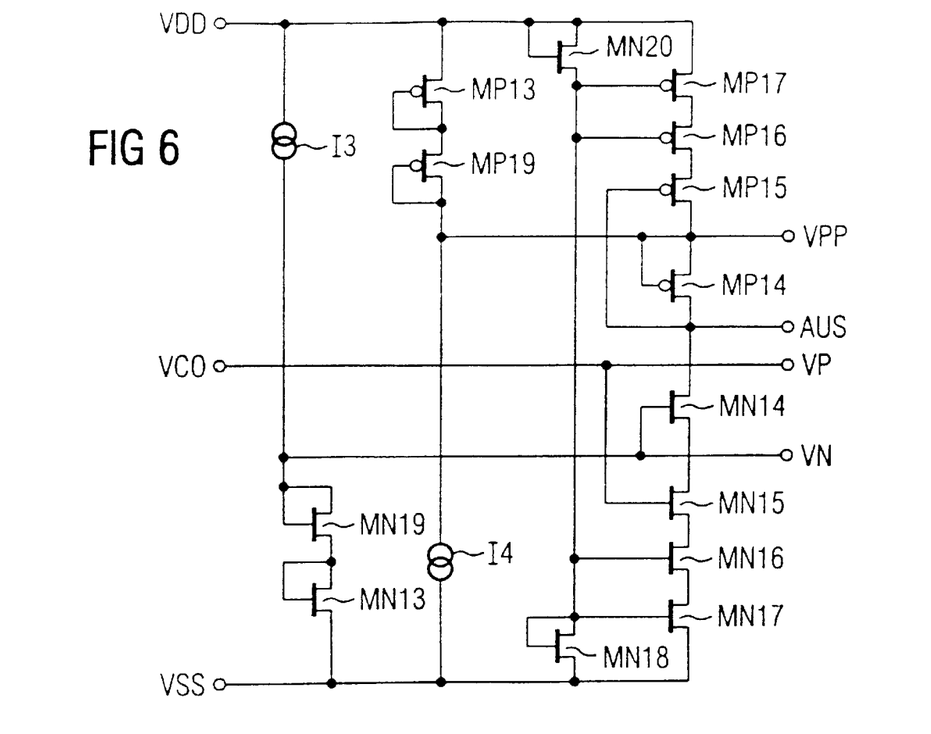
FIG. 6 is a circuit diagram of a circuit for generating control signals for the drivers and the integrators shown in FIGS. 3–5.

The integrator shown in FIG. 4 and also the driver shown in FIG. 5 are driven depending on the control signals VP, VPP, VNN and VN which are derived from the output signal VCO of the regulating amplifier RV (see FIG. 1). Accordingly, the charge pump shown in FIG. 3 must have a control circuit which generates the corresponding control signals VP, VPP, VNN and VN, respectively, depending on the output signal VCO of the regulating amplifier RV. A corresponding control circuit is illustrated by way of example in FIG. 6, which once again has a combination of p-channel junction field-effect transistors MP13–MP1 and n-channel junction field-effect transistors MN13–MN20. Furthermore, the control circuit includes internal current sources I3 and I4. The more detailed circuitry connections can be inferred from FIG. 6. Since, according to FIG. 3, the individual integrators IN1–IN4 and drivers TR1–TR4 are intended to be set jointly depending on the control signal VCO of the regulating amplifier RV, it suffices to provide a central control circuit, corresponding to the circuit shown in FIG. 6, in the charge pump, which generates the control signals VPP, VP, VN and VNN depending on the control signal VCO. As an alternative, however, it is also conceivable for the circuit shown in FIG. 6 to be integrated in each of the circuits shown in FIGS. 4 and 5, that is to say in each integrator and driver circuit.

Figure 7:
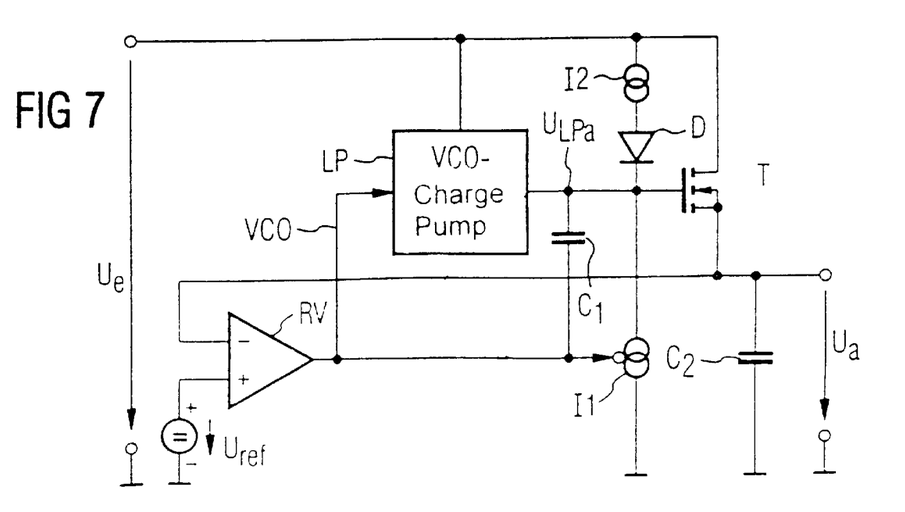
FIG. 7 is a circuit diagram of the voltage regulator according to a further preferred exemplary embodiment.

Finally, FIG. 7 shows a further preferred exemplary embodiment of the voltage regulator according to the invention, in which case it is possible to use, in particular, the variable-frequency charge pump LP (VCO charge pump) which is shown in FIG. 3 and whose frequency is once again set depending on the output signal VCO of the regulating amplifier RV, in order, consequently, to adapt the frequency of the charge pump LP to the instantaneous load or to the required current output and, consequently, to minimize the current consumption of the charge pump. Furthermore, according to FIG. 7, the regulating amplifier RV is configured as a so-called Class B amplifier with a low quiescent current and generates, given a sufficiently high input voltage (for example greater than 8 V), such a control signal VCO for the charge pump LP which corresponds to the frequency 0. In order to maintain the gate charge required for the actuating transistor T in this case, too, according to FIG. 7 a further current source I2 is provided, which is coupled to the gate terminal of the transistor T via a diode D. The current consumption of the voltage regulator can be reduced further with the aid of the voltage regulator circuit shown in FIG. 7.

I claim:

1. A circuit configuration for a charge pump, comprising:

a first series circuit of n integrators having a first integrator and a last integrator generating an output signal;

a first feedback path and a second feedback path;

one of said integrators of said first series circuit generating an output signal and receiving, as an input signal, a summation signal formed from said output signal of said one of said integrators of said first series circuit fed back via said first feedback path, a second input signal and a third input signal;

a second series circuit of n further integrators having a first integrator and a last integrator generating an output signal;

a further first feedback path and a further second feedback path;

one of said integrators of said second series circuit generating an output signal and receiving, as an input signal, a summation signal formed from said output signal of said one of said integrators of said second series circuit fed back via said further first feedback path, a second input signal and a third input signal;

said output signal of said one of said integrators of said second series circuit fed back via said second feedback path forming said second input signal of said one of said integrators of said first series circuit;

said output signal of said one of said integrators of said first series circuit fed back via said further second feedback path forming said second input signal of said one of said integrators of said second series circuit;

said output signal of said last integrator of said second series circuit forming said third input signal of said one of said integrators corresponding to said first integrator of said first series circuit;

said output signal of said last integrator of said first series circuit supplying said third input signal of said one of said integrators corresponding to said first integrator of said second series circuit;

said third input signal for remaining integrators of said first series circuit supplied by an output signal of a preceding integrator of said integrators of said first series circuit;

said third input signal for remaining integrators of said second series circuit supplied by an output signal of a preceding integrator of said integrators of said second series circuit; and said integrators of said first series circuit and said second series circuit having outputs that can be picked off outputting output signals phase-shifted with respect to one another.

2. The circuit configuration according to claim 1, wherein said first feedback path and said further first feedback path are assigned a common first gain factor K1, and said second feedback path and said further second feedback path are assigned a common second gain factor K2, the common first gain factor K1 and the common second gain factor K2 being chosen such that they fulfill the following equations: K2>K1, K2−K1<1 and K1+K2>1.

3. The circuit configuration according to claim 1, wherein n=2, and said output signals phase-shifted with respect to one another of said integrators of said first series circuit and said second series circuit being four substantially sinusoidal output signals phase-shifted in each case by 90° with respect to one another and can be picked off at said outputs of said integrators of said first series circuit and said second series circuit.

4. The circuit configuration according to claim 1, wherein said integrators of said first series circuit and said second series circuit are controllable with regard to their transfer characteristic, current consumption and maximum switching frequency.

5. The circuit configuration according to claim 1, wherein each of said integrators is an inverter controllable by a plurality of control signals.

6. The circuit configuration according to claim 5, wherein each of said integrators has controllable resistors and an output current set by said controllable resistors.

7. The circuit configuration according to claim 6, wherein said controllable resistors are field-effect transistors.

8. The circuit configuration according to claim 7, wherein said controllable resistors formed by said field-effect transistors are connected in parallel with one another.

9. The circuit configuration according to claim 7, wherein said controllable resistors formed by said field-effect transistors are connected in series with one another.

10. The circuit configuration according to claim 5, wherein each of said integrators has a current flow and transistors that can be controlled depending on the control signals, and said transistors control the current flow for setting a transfer characteristic and a current drawn.

11. The circuit configuration according to claim 5, wherein each of said integrators includes:
a positive supply voltage terminal;
a negative supply voltage terminal;
a first input terminal for receiving said third input signal;
a second input terminal for receiving said second input signal supplied by a corresponding integrator of the other series circuit;
a first and second control terminal for receiving a first and second control signal, respectively;
an output terminal for outputting an output signal;
a plurality of transistors having main current paths and including a first transistor, a second transistor, a third transistor, a fourth transistor, a fifth transistor, a sixth transistor, a sixth transistor, a seventh transistor, an eighth transistor, a ninth transistor and a tenth transistor;
a series circuit formed by said main current paths of said first and fourth transistors connected between said positive supply voltage terminal and said output terminal;
said first transistor having a control terminal connected to said first input terminal;
said fourth transistor having a control terminal connected to said first control terminal;
a series circuit formed by said main current paths of said second, third and fifth transistors connected in parallel with said series circuit formed by said first and fourth transistors;
said second transistor having a control terminal connected to said second input terminal;
said third transistor having a control terminal connected to said output terminal;
said fifth transistor having a control terminal connected to said first control terminal; and
said sixth, seventh, eighth, ninth and tenth transistors connected to said negative supply voltage terminal, said second control terminal, said first input terminal, said second input terminal and said output terminal in a mirror-symmetrical manner with respect to said first, second, third, fourth and fifth transistors.

12. The circuit configuration according to claim 11, wherein said first, second, third, fourth and fifth transistors are p-channel field-effect transistors and said sixth, seventh, eighth, ninth and tenth transistors are n-channel field-effect transistors.

13. The circuit configuration according to claim 11, wherein each of said integrators further includes a third and fourth control terminal for receiving a third and fourth control signal, respectively, as well as eleventh and twelfth transistors, said eleventh transistor having a control terminal and a main current path connected between said series circuit formed by said first and fourth transistors and said output terminal, and said control terminal of said eleventh transistor connected to said third control terminal, and said twelfth transistor having a control terminal and a main current path connected between said series circuit formed by said sixth and tenth transistors and said output terminal, and said control terminal of said twelfth transistor connected to said fourth control terminal.

14. The circuit configuration according to claim 11, wherein said first transistor and said sixth transistor are formed in each case by two series-connected transistors having common control terminals.

15. The circuit configuration according to claim 5, including a control circuit for generating said plurality of control signals depending on a central control signal fed in externally and defining a switching frequency of said integrators.

16. The circuit configuration according to claim 15, wherein said control circuit for generating said plurality of control signals includes:
a positive supply voltage terminal;
a negative supply voltage terminal;
an input terminal for receiving the central control signal;
four output terminals including a first output terminal, a second output terminal, a third output terminal and a fourth output terminal for outputting a first, second, third and fourth control signal, respectively, to said integrators;
two current sources;
a plurality of transistors having main current paths and including a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor and a fourteenth transistor;
a series circuit formed by one of said two current sources and said main current paths of said first and second transistors and connected between said positive supply voltage terminal and said negative supply voltage terminal;
a series circuit formed by said main current paths of said third and fourth transistors and a second one of said two current sources and connected between said positive supply voltage terminal and said negative supply voltage terminal;

a series circuit formed by said main current paths of said fifth and sixth transistors and connected between said positive supply voltage terminal and said negative supply voltage terminal;

a series circuit formed by said main current paths of said seventh, eighth, ninth, tenth, eleventh, twelfth, thirteenth and fourteenth transistors connected between said positive supply voltage terminal and said negative supply voltage terminal;

said twelfth transistor having a control terminal connected to said input terminal and said second output terminal;

said ninth transistor having a control terminal connected to said first output terminal;

said eleventh transistor having a control terminal connected to said third output terminal;

said third output terminal connected between said one of said two current sources and said series circuit of said first and second transistors; and said tenth transistor having a control terminal connected to said fourth output terminal, said fourth output terminal connected between said second one of said two current sources and said series circuit of said third and fourth transistors.

17. The circuit configuration according to claim 16, wherein said first, second, fifth, sixth, eleventh, twelfth, thirteenth and fourteenth transistors are n-channel field-effect transistors, and said third, fourth, seventh, eighth, ninth and tenth transistors are p-channel field-effect transistors.

18. The circuit configuration according to claim 16, including controllable drivers having adjustable edge steepnesses and said output signals of said integrators are passed via said controllable drivers.

19. The circuit configuration according to claim 18, wherein each of said controllable drivers includes:

an input terminal for receiving an output signal of a corresponding integrator;

an output terminal for outputting an output signal;

a first control terminal and a second control terminal for receiving the first and second control signal, respectively, of said control circuit;

a positive supply voltage terminal;

a negative supply voltage terminal;

a plurality of transistors having main current paths and including a first transistor, a second transistor, a third transistor, a fourth transistor, a fifth transistor, a sixth transistor, a seventh transistor, an eighth transistor, a ninth transistor, a tenth transistor, an eleventh transistor, and a twelfth transistor;

a series circuit formed by said main current paths of said first, second and third transistors connected to said positive supply voltage terminal;

a series circuit formed by said main current paths of said fifth and sixth transistors connected between said positive supply voltage terminal and said output terminal;

said fourth transistor connected by its main current path to a node between said second and third transistors;

said first transistor having a control terminal connected to said input terminal;

said second, third and sixth transistors each having a control terminal connected to said first control terminal;

said fourth and fifth transistors each having a control terminal connected to one another; and said seventh, eighth, ninth, tenth, eleventh and twelfth transistors connected up to said input terminal, said output terminal, said second control terminal and said negative supply voltage terminal mirror-symmetrically with respect to said first, second, third, fourth, fifth and sixth transistors such that said third transistor is coupled to said tenth transistor, and said ninth transistor is coupled to said fourth transistor.

20. The circuit configuration according to claim 19, wherein said first, second, third, fourth, fifth and sixth transistors are p-channel field-effect transistors and said seventh, eighth, ninth, tenth, eleventh and twelfth transistors are n-channel field-effect transistors.

21. A voltage regulator circuit, comprising:

an input terminal for receiving an input voltage;

an output terminal for providing a regulated output voltage;

a transistor having a control terminal and a main current path connected between said input terminal and said output terminal;

a regulating amplifier having an input terminal receiving the regulated output voltage and an output terminal outputting a control signal;

a capacitor connected between said control terminal of said transistor and said output terminal of said regulating amplifier;

a controllable current source for discharging said capacitor; and a charge pump for applying a voltage that can be controlled by said regulating amplifier to said control terminal of said transistor, said charge pump having a switching frequency that can be altered depending on the control signal output by said regulating amplifier.

22. The voltage regulator circuit according to claim 21, wherein said charge pump includes:

a first series circuit of n integrators having a first integrator and a last integrator generating an output signal;

a first feedback path and a second feedback path;

one of said integrators of said first series circuit generating an output signal and receiving, as an input signal, a summation signal formed from said output signal of said one of said integrators of said first series circuit fed back via said first feedback path, a second input signal and a third input signal;

a second series circuit of n further integrators having a first integrator and a last integrator generating an output signal;

a further first feedback path and a further second feedback path;

one of said integrators of said second series circuit generating an output signal and receiving, as an input signal, a summation signal formed from said output signal of said one of said integrators of said second series circuit fed back via said further first feedback path, a second input signal and a third input signal;

said output signal of said one of said integrators of said second series circuit fed back via said second feedback path forming said second input signal of said one of said integrators of said first series circuit;

said output signal of said one of said integrators of said first series circuit fed back via said further second feedback path forming said second input signal of said one of said integrators of said second series circuit;

said output signal of said last integrator of said second series circuit forming said third input signal of said one of said integrators corresponding to said first integrator of said first series circuit;

said output signal of said last integrator of said first series circuit supplying said third input signal of said one of said integrators corresponding to said first integrator of said second series circuit;

said third input signal for remaining integrators of said first series circuit supplied by an output signal of a preceding integrator of said integrators of said first series circuit;

said third input signal for remaining integrators of said second series circuit supplied by an output signal of a preceding integrator of said integrators of said second series circuit; and said integrators of said first series circuit and said second series circuit having outputs that can be picked off outputting output signals phase-shifted with respect to one another.

23. The voltage regulator circuit according to claim 21, wherein said transistor is a DMOS field-effect transistor.

24. The voltage regulator circuit according to claim 21, wherein said regulating amplifier is a Class B amplifier with a low quiescent current.

25. The voltage regulator circuit according to claim 24, including a further current source coupled to said control terminal of said transistor, in that, given an input voltage of a specific magnitude, said regulating amplifier generates the control signal for said charge pump, said control signal corresponding to a switching frequency zero, and said further current source configured and disposed such that it maintains a sufficiently high control charge for said control terminal of said transistor even in a case of the control signal of said regulating amplifier corresponding to the switching frequency zero.

* * * * *